United States Patent [19]
Schultz et al.

[11] Patent Number: 6,034,557
[45] Date of Patent: Mar. 7, 2000

[54] DELAY CIRCUIT WITH TEMPERATURE AND VOLTAGE STABILITY

[75] Inventors: David P. Schultz, San Jose; Scott O. Frake, Cupertino, both of Calif.

[73] Assignee: Xilinx, Inc., San Jose, Calif.

[21] Appl. No.: 09/127,309

[22] Filed: Jul. 31, 1998

[51] Int. Cl.$^7$ ...................................................... H03K 5/13
[52] U.S. Cl. .......................................... 327/276; 327/278
[58] Field of Search ...................................... 327/261–264, 327/269, 270, 276, 278, 281, 288; 331/57

[56] References Cited

U.S. PATENT DOCUMENTS

| | | | |
|---|---|---|---|
| 4,806,804 | 2/1989 | O'Leary | 327/277 |
| 4,853,654 | 8/1989 | Sakurai | 331/57 |
| 5,081,380 | 1/1992 | Chen | 327/262 |
| 5,250,914 | 10/1993 | Konno | 331/111 |
| 5,300,837 | 4/1994 | Fischer | 327/281 |
| 5,453,709 | 9/1995 | Tanimoto et al. | 327/276 |
| 5,491,456 | 2/1996 | Kay et al. | 331/57 |
| 5,544,120 | 8/1996 | Kuwagata et al. | 365/222 |

OTHER PUBLICATIONS

Paul R. Gray and Robert G. Meyer, "Analysis and Design of Analog Integrated Circuits," 2nd Edition, 1977, pp. 734–735.

D. Hodges and H. Jackson, "Analysis and Design of Digital Integrated Circuits," 2nd Edition, 1983, pp. 335–337.

*Primary Examiner*—Tuan T. Lam
*Attorney, Agent, or Firm*—Arthur J. Behiel; Edel M. Young

[57] ABSTRACT

Described are delay circuits that are relatively insensitive to changes in temperature and supply voltage. A delay circuit includes at least one inverter circuit made up of a pair of transistors. The inverter responds to voltage changes on the input terminal by providing corresponding inverse changes on the output terminal. The speed at which the inverter responds to voltage changes on the input terminal depends upon the ability of one or both transistors to conduct current to or from the output terminal. The ability of one or both transistors in the inverter to move charge to or from the output terminal is restricted to reduce the switching speed of the inverter, thus imposing a delay on the input signal. Further, the restricted current is provided at a reference level that is relatively insensitive to temperature changes and supply-voltage fluctuations.

5 Claims, 5 Drawing Sheets

DELAY CIRCUIT WITH TEMPERATURE AND VOLTAGE STABILITY

FIELD OF THE INVENTION

This invention relates generally to delay circuits, and in particular to delay circuits that provide delay periods that remain relatively constant despite temperature and supply-voltage fluctuations.

BACKGROUND

Delay circuits are ubiquitous in digital integrated circuits. They are used, for example, to ensure two clock lines of different lengths (and therefore different signal propagation times) deliver their respective clock signals contemporaneously.

FIG. 1 shows a conventional delay circuit 100 for producing a desired delay time when an input signal (Vin) changes between logic levels. Delay circuit 100 includes a first compensating circuit 1 for NMOS transistors, a second compensating circuit 2 for PMOS transistors, and four inverter stages I1, I2, I3, and I4. Inverters I2 and I4 include respective NMOS transistors N2 and N5, each receiving as a gate signal an output signal NO from compensating circuit 1 and connected in series to the respective sources of NMOS transistors N3 and N6. Inverters I1 and I3 include respective PMOS transistors P2 and P5 receiving as a gate signal an output signal PO from compensating circuit 2 and connected in series to the respective sources of PMOS transistors P1 and P4.

FIG. 2A is a circuit diagram showing compensating circuit 1 for NMOS transistors. Compensating circuit 1 includes a resistor R1 and an NMOS transistor N7 connected in series between the power-source voltage Vcc and ground. An output signal NO is supplied from the connection point between the resistor R1 and the transistor N7. The gate signal CE (chip enable) of NMOS transistor N7 is the power-supply voltage Vcc in operation.

Compensation circuit 1 compensates for changes in transistor threshold voltages $V_{TH}$ that affect all transistors and that occur due to process variations. As $V_{TH}$ decreases, the on impedance of NMOS transistor N7 decreases, lowering the potential of output signal NO to the gates of transistors N2 and N4. Thus, when $V_{TH}$ is relatively small, a reduction in the gate voltage on transistors N2 and N4 offsets the decrease in on-impedances of transistors N2 and N4 due to the small $V_{TH}$. The circuit functions in the opposite manner when $V_{TH}$ is relatively large. In this way, compensating circuit 1 maintains a relatively constant delay time for each of inverters I2 and I4.

FIG. 2B is a circuit diagram showing compensating circuit 2 for PMOS transistors. The second compensating circuit 2 includes a PMOS transistor P7 and a resistor R2 connected in series between the power-source voltage Vcc and ground. An output signal PO is supplied from the connection point between the transistor P7 and the resistor R2. The gate signal /CE (chip-enable not) of PMOS transistor P7 is at the ground potential in operation. Compensation circuit 2 operates substantially as described above in connection with compensation circuit 1. A description of the operation of compensation circuit 2 is therefore omitted for brevity.

The compensation circuits of delay circuit 100 compensate for changes in the delay period of delay circuit 100 that normally occur due to process variations. However, Circuit 100 is still sensitive to temperature and supply-voltage variations that can induce undesirable changes in the delay period. Voltage NO of FIG. 2A is a function of the supply voltage Vcc, the resistance R1, and the characteristics of transistor N7. Changes in the transistor characteristics of transistor N7 that result from temperature variations may be compensated for by similar changes in transistors N2 and N5; however, resistor R1 may also be affected by a change in temperature, and this will change the voltage of NO in a manner that is not compensated for in circuit 100. Consequently, the delay of circuit 100 may change. Voltage supply variation will likewise affect the voltage NO in a way that is not compensated for in circuit 100, thus further affecting the delay. An analogous situation exists for voltage PO, transistor P7, and resistor R2 of FIG. 2B, and transistors P2 and P5 of FIG. 1.

Another potential problem associated with delay circuit 100 is that the delay imposed on the positive-going portion of the input signal can differ from that of the negative-going portion of the input signal because separate compensation circuits are used to establish the reference voltages for the respective PMOS and NMOS transistors. There therefore remains a need for delay circuits that are less sensitive to temperature and supply-voltage fluctuations.

SUMMARY

The present invention addresses the need for a delay circuit that is relatively insensitive to changes in temperature and supply voltage. A delay circuit in accordance with the invention includes at least one inverter circuit made up of a pair of transistors. As is conventional, the inverter responds to voltage changes on the input terminal by providing corresponding inverse changes on the output terminal. The speed at which the inverter responds to voltage changes on the input terminal depends upon the ability of one or both transistors to conduct current to or from the output terminal. In accordance with the invention, the ability of one or both transistors in the inverter to draw from or provide current to the output terminal is restricted to reduce the switching speed of the inverter, thus imposing a delay on the input signal. Further, the current is not merely restricted, but is provided at a reference level that is relatively insensitive to temperature and supply-voltage fluctuations.

In one embodiment of the invention a current source establishes a constant reference current through a current mirror, and the current mirror is used in turn to control the current to or from the output terminal of the inverter. The current source can be a conventional thermal-voltage-referenced current source or some other type of current source.

Restricting the current to and from the output terminal of the inverter causes the voltage on the output terminal to change relatively slowly. These slow changes can render the delay circuit susceptible to noise, such as high-frequency power-supply voltage fluctuations. For this reason some embodiments include a conventional Schmitt trigger connected to the output terminal of the inverter. The Schmitt trigger responds to each slowly changing signal from the inverter with an output signal having a fast transition time.

In one embodiment of the invention only one transistor of the inverter is current referenced. Consequently, this embodiment delays only positive-going pulse edges or only negative-going pulse edges. This embodiment may be used, for example, to create an oscillator that is insensitive to temperature and supply-voltage fluctuations.

While the foregoing embodiment only delays one pulse edge, two such circuits can be combined to delay both pulse edges. For example, separating two such delay circuits with a simple inverter creates a delay circuit that delays one edge (e.g., the positive-going edge), inverts the resulting signal, and then delays the opposite edge (e.g., the negative-going edge).

In yet another embodiment of the invention, each of the transistors in one inverter are connected to a respective current-limiting transistor. Preferably, the currents through each of the current-limiting transistors are each established using a single current reference to ensure that identical currents raise and lower the voltage level on the output terminal of the inverter. These identical currents can be established using a reference current source to supply the limited current for one transistor of the inverter and a current mirror reflecting this reference current to supply the same limited current for the other transistor of the inverter.

DETAILED DESCRIPTION

Figure 1:
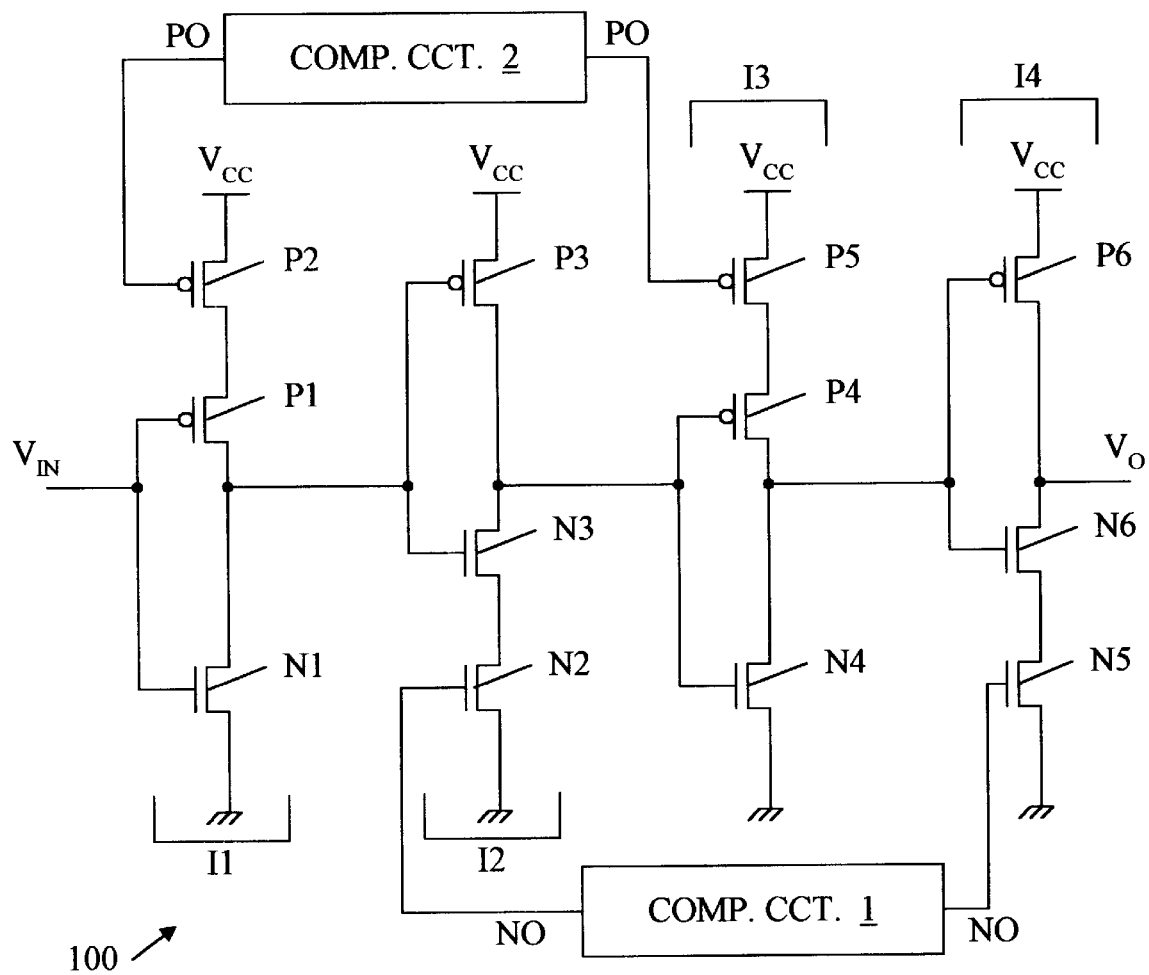
FIG. 1 shows a conventional delay circuit 100 for producing a desired delay time when an input signal (Vin) changes between logic levels.
Figure 2A:
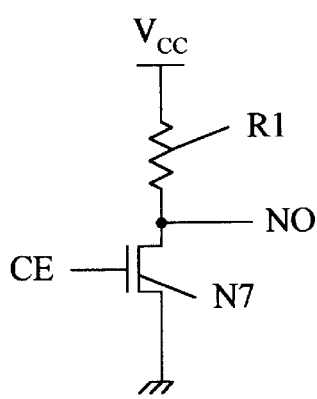
FIG. 2A is a circuit diagram showing compensating circuit 1 for NMOS transistors.
Figure 2B:
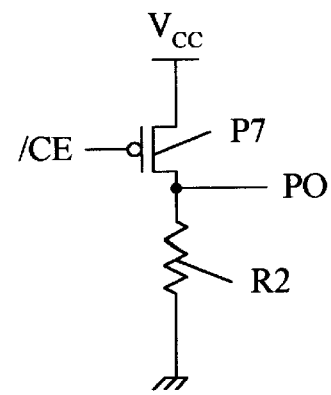
FIG. 2B is a circuit diagram showing compensating circuit 2 for PMOS transistors.
Figure 3A:
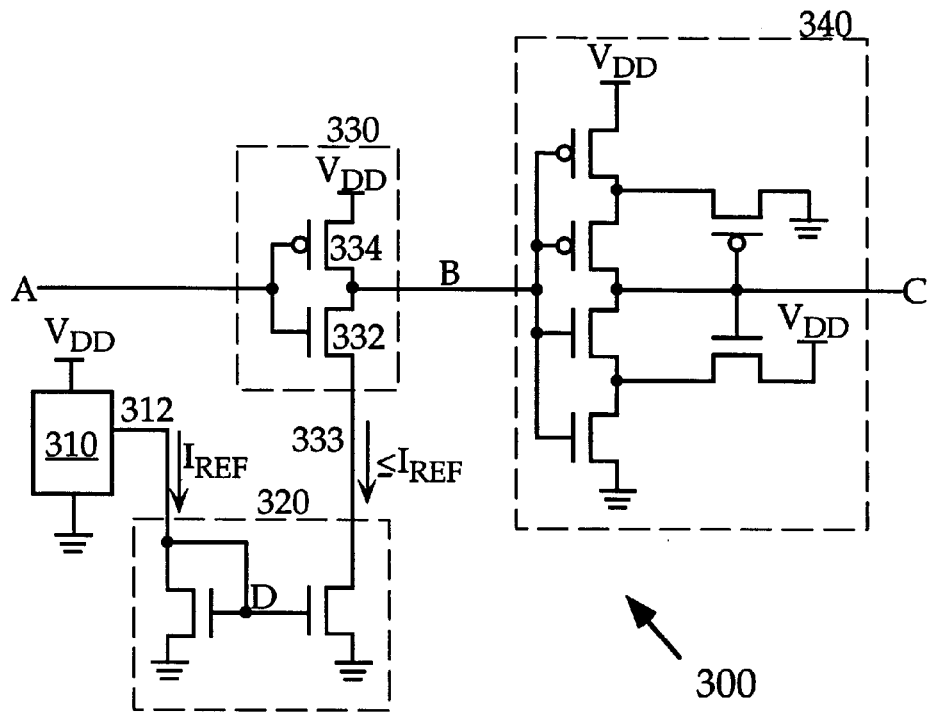
FIG. 3A depicts a delay circuit 300 in accordance with one embodiment of the present invention.
Figure 7:
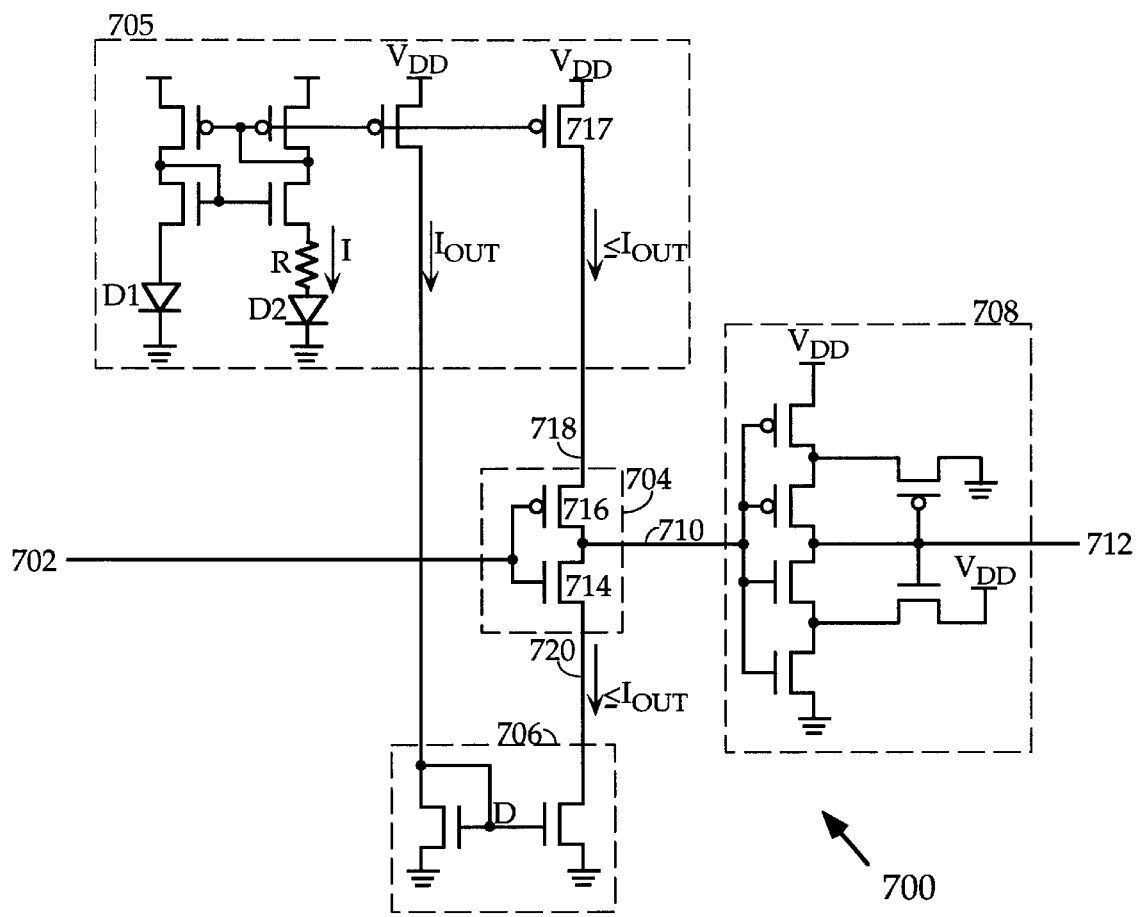
FIG. 7 is a schematic diagram of a delay circuit 700 in accordance with another embodiment of the invention.

FIG. 3A depicts a delay circuit 300 in accordance with one embodiment of the present invention. Delay circuit 300 includes a conventional constant current source 310 having a reference-current terminal 312 connected to an input terminal of a conventional current mirror 320. (A suitable constant current current source is shown in FIG. 7, discussed below.) The control terminal A of inverter 330 is the input terminal of delay circuit 300. The output terminal B of inverter 330 is connected to an input terminal of a conventional Schmitt trigger 340. The output terminal C of Schmitt trigger 340 is the output terminal of delay circuit 300.

Current source 310 provides a reference current $I_{REF}$ that is relatively insensitive to fluctuations in supply-voltage and temperature. This stable reference current in turn causes current mirror 320 to limit the current of the ground-side power terminal of a conventional CMOS inverter 330 to $I_{REF}$. Then, as explained below in detail, the output current of inverter 330 defines the delay period of delay circuit 300. Current source 310 is preferably selected to provide excellent temperature and supply-voltage stability.

The output terminal of current mirror 320 is connected to the source of an NMOS transistor 332 (the ground-side power terminal of inverter 330) via a line 333. Inverter 330 also includes a PMOS transistor 334 connected between a supply terminal $V_{DD}$ and the drain of NMOS transistor 332. The source of PMOS transistor 334 is the supply-side power terminal of inverter 330.

As is well known to those of skill in the art, Schmitt triggers are regenerative circuits that respond to slowly changing input signals with fast transition times at their outputs. While not absolutely necessary, Schmitt trigger 340 improves circuit performance by reducing the susceptibility of delay circuit 300 to noise, such as high-frequency voltage fluctuations on supply terminal $V_{DD}$, during the relatively slow voltage change on terminal B. For a detailed description of conventional Schmitt triggers, see D. Hodges and H. Jackson, *Analysis and Design of Digital Integrated Circuits*, pp. 335–337 ($2^{nd}$ ed. 1983), which is incorporated herein by reference.

Figure 3B:
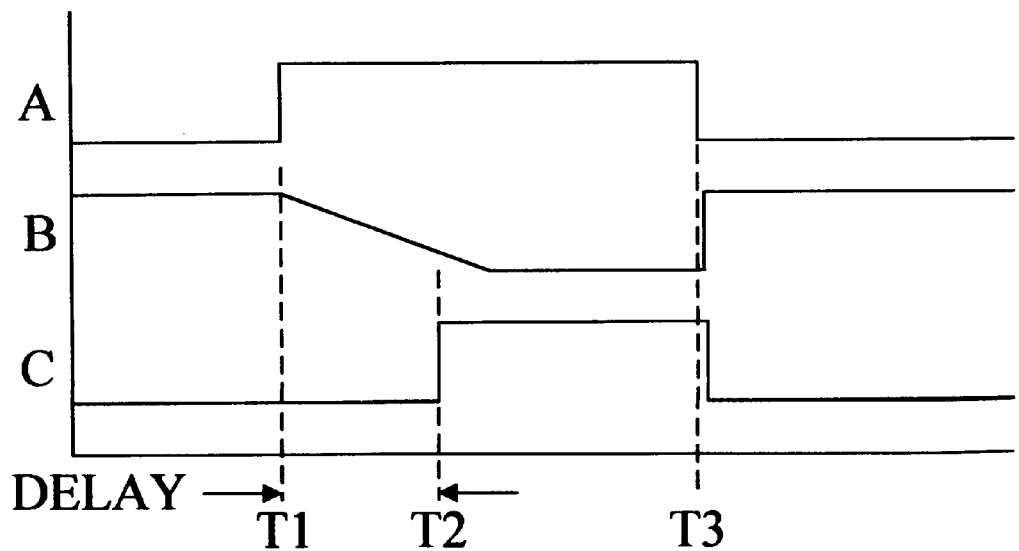
FIG. 3B is a timing diagram depicting the operation of delay circuit 300 of FIG. 3A.

FIG. 3B is a timing diagram depicting the operation of delay circuit 300 of FIG. 3A. The waveforms A, B, and C of FIG. 3B correspond to like-named terminals of delay circuit 300.

At time $T_1$, the signal on terminal A transitions from a logic zero (e.g., zero volts) to a logic one (e.g., 3.3 volts), thus turning on transistor 332. The voltage level on terminal B then begins to fall at a rate determined by the reference current $I_{REF}$ as current mirror 320 pulls charge away from terminal B. The voltage on terminal B falls to the threshold of Schmitt trigger 340 at time $T_2$, thereby causing the output terminal of Schmitt trigger 340 (terminal C) to transition from a logic zero to a logic one. As a result of the delayed discharge of terminal B, the rising edge of the signal on terminal A is delayed by an amount determined by the reference current $I_{REF}$, as controlled by current source 310.

When the voltage level on terminal A returns to a logic zero at time T3, transistor 334 quickly pulls the voltage on terminal B up to the voltage level on supply terminal $V_{DD}$. The delay imposed by current mirror 120 and associated circuitry does not affect the speed at which terminal B returns to a logic one because terminal B is connected directly to supply terminal $V_{DD}$ via transistor 334. Schmitt trigger 340 reacts quickly to the voltage change on terminal B so that the voltage on terminal C returns to a logic zero.

Figure 4A:
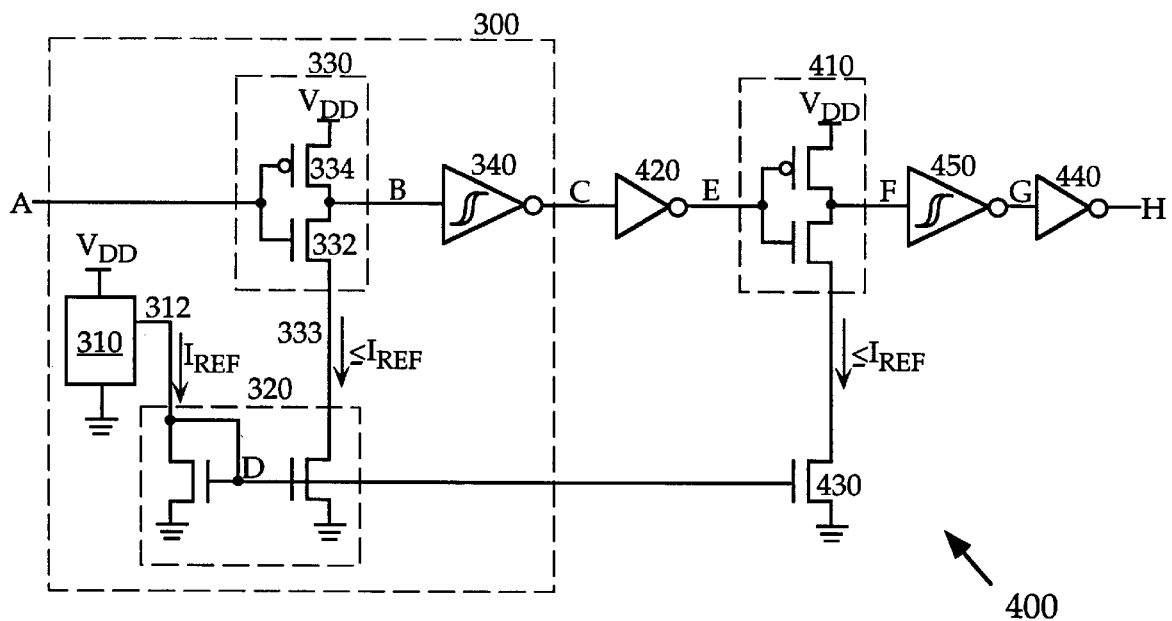
FIG. 4A depicts a delay circuit 400 in accordance with the present invention that delays both the rising and falling edges of the input signal on terminal A.

Delay circuit 300 only delays the rising edge of the input signal on terminal A. FIG. 4A depicts a delay circuit 400 that delays both the rising and falling edges of the input signal on terminal A. Delay circuit 400 includes delay circuit 300 of FIG. 3A connected to a current-limited CMOS inverter 410 via a conventional inverter 420. Terminal D of current mirror 320 is connected to the ground-side power terminal of inverter 410 via a conventional NMOS transistor 430, an extension of current mirror 320. Thus connected, inverter 410 functions identically to inverter 330.

Delay circuit 400 delays the rising edge of the input signal on terminal A using delay circuit 300 as described above in connection with FIGS. 3A and 3B. Inverter 420 then inverts the resulting signal so that inverter 410 can similarly delay the falling edge of the signal on terminal A. The output of inverter 410 is coupled to yet another conventional inverter 440 via a conventional Schmitt trigger 450. The output of delay circuit 400 is taken from terminal G, the output of inverter 440.

Figure 4B:
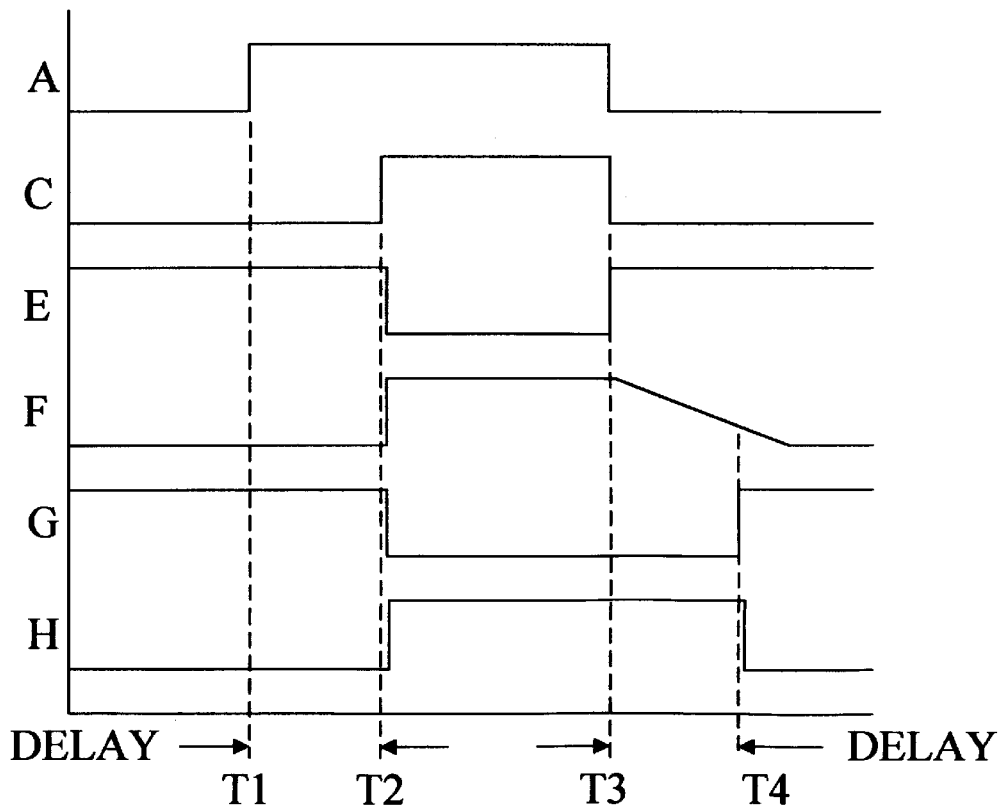
FIG. 4B is a timing diagram depicting the operation of delay circuit 400.

FIG. 4B is a timing diagram depicting the operation of delay circuit 400. The waveforms A, C, E, F, G, and H correspond to like-named terminals of delay circuit 400. The operation of delay circuit 400 is similar to that of delay circuit 300 except that delay circuit 400 delays both the rising and the falling edges of the signal on terminal A. Using the same current source and identical current-limited inverters advantageously ensures that the delays imposed on the rising and falling edges of the input signal on terminal A are identical. A complete description of delay circuit 400 is omitted for brevity.

Figure 5:
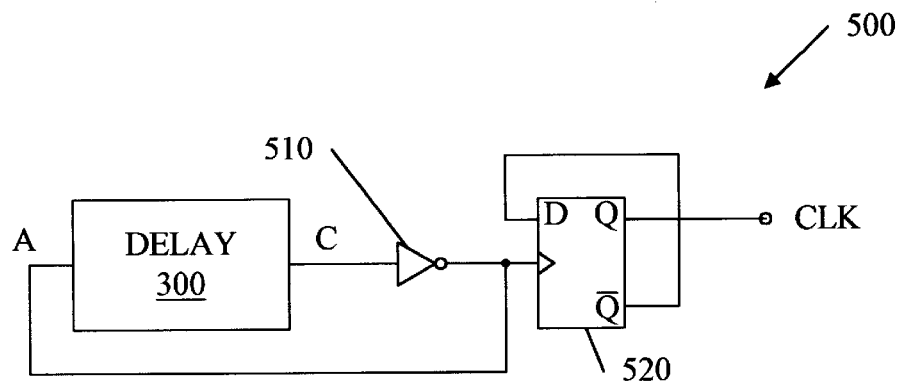
FIG. 5 is a simple schematic diagram of an oscillator 500 implemented using delay circuit 300 of FIG. 3A.

FIG. 5 is a simple schematic diagram of an oscillator 500 implemented using delay circuit 300 of FIG. 3A. Oscillator 500 includes a conventional inverter 510 coupled between delay circuit 300 and the clock input terminal of a conventional flip-flop 520. Oscillator 500 exhibits excellent frequency stability due to the voltage and temperature stability of delay circuit 300. As will be readily understood by those of skill in the art, flip-flop 520 toggles on each rising edge of the signal on terminal A. Consequently, the output signal of oscillator 500 on line CLK will have a 50% duty cycle and will oscillate at a frequency of one-half that of the signal on terminal A.

Figure 6:
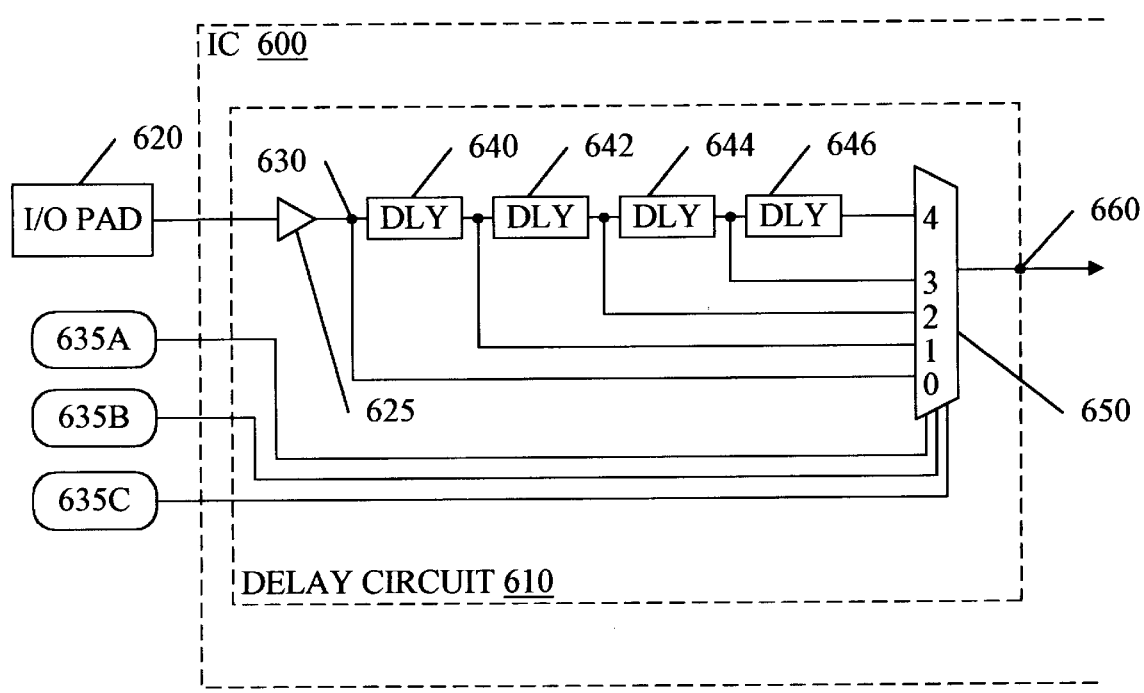
FIG. 6 depicts an integrated circuit 600 that includes a variable-delay circuit 610 in accordance with an embodiment of the present invention.

FIG. 6 depicts an integrated circuit 600 that includes a variable delay circuit 610 in accordance with an embodiment of the present invention. Delay circuit 610 receives input signals on an input terminal 620 and conveys these signals through buffer 625 to a buffered input terminal 630. Additional input terminals 635A–C accept delay instructions that selectively route the signal on buffered input terminal 630 through zero to four delay circuits 640, 642, 644, and 646 to input terminals of a multiplexer 650. Each of delay circuits 640, 642, 644, and 646 is identical to delay circuit 300 described above in connection with FIGS. 3A and 3B. Multiplexer 650 conventionally selects one of five input signals 0–4 based upon the delay instructions on input terminals 635A–C, and provides the selected signal on an output terminal 660. The signal levels on input terminals 635A–C thus determine the delay period applied to the input signals on input terminal 620. Input terminals 620 and 635A–C can be either internal terminals in IC 600 or externally accessible pins.

For ease of illustration, only four delay circuits are depicted in FIG. 6. A greater number of delay circuits increases the cost of implementing delay circuit 610, but offers increased total delay and/or less delay granularity. For example, one embodiment includes seven delay circuits connected to output terminal 660 via a multiplexer with three select terminals. This configuration allows a user to select from among eight possible delay periods (including no delay).

For additional applications of delay circuit 300, see the commonly assigned U.S. patent application Ser. No. 09/053,879, filed Apr. 1, 1998, entitled "User-Controlled Delay Circuit for a Programmable Logic Device," by Robert O. Conn and Peter Alfke [docket X-388 US], which is incorporated herein by reference.

FIG. 7 is a schematic diagram of a delay circuit 700 in accordance with another embodiment of the invention. Delay circuit 700 includes an input terminal 702 connected to an inverter 704. The switching speed of inverter 704, and thus the signal propagation delay of delay circuit 700, is limited by a current source 705 and a current mirror 706. The output terminal of inverter 704 connects to an input terminal of a conventional Schmitt trigger 708 via a line 710. Schmitt trigger 708 includes an output terminal 712 that provides the output signal for delay circuit 700.

Current source 705 is a conventional thermal-voltage ($V_T$)-referenced current source. Diodes D1 and D2 have areas that differ by a factor of n. The circuit configuration forces them to operate at the same bias current; consequently, the difference between the voltage drops across diodes D1 and D2 appears across the resistor R. The resulting current through resistor R is given by:

$$I=(V_T/R)\ln(n)$$

where $V_T$ is the thermal voltage (i.e., kT/q). The foregoing terms and equations are well known to those of skill in the art.

The advantage of current source 705 is that both $V_T$ and R have positive temperature coefficients. Thus, the current I, as described by the forgoing fraction, tends to be relatively insensitive to temperature changes. As a consequence, the output current $I_{OUT}$ of current source 705, which is derived from the current I, is also relatively insensitive to temperature changes. For a detailed description of $V_T$-referenced current sources, see P. Gray and R. Meyer, *Analysis and Design of Analog Integrated Circuits*, pp. 734–5 ($2^{nd}$ ed. 1977), which is incorporated herein by reference.

Current mirror 706 is a conventional current mirror configured to mirror current $I_{OUT}$ SO that the pull-down current of inverter 704 is limited to $I_{OUT}$ (or in another embodiment to a specified constant times $I_{OUT}$). The pull-up current of inverter 704 is similarly limited to $I_{OUT}$ through the mirroring effect of a transistor 717.

Inverter 704 includes an NMOS transistor 714 and a PMOS transistor 716. Inverter 704 is connected to current source 705 and current mirror 706 via respective power terminals 718 and 720 (i.e., the sources of transistors 716 and 714). Thus configured, the switching speed of inverter 704 is limited in one direction by the current through transistor 717 and in the other direction to the same current level through current mirror 706.

The delay imposed by delay circuit 700 depends upon the level of current provided by the combination of current source 705 and current mirror 706. The current from transistor 717 limits the switching speed of inverter 704 when switching line 710 from a logic zero to a logic one. Conversely, the current through current mirror 706 limits the switching speed of inverter 704 when switching line 710 from a logic one to a logic zero. Thus, the current from transistor 717 imposes a precise delay on negative-going input signals on input terminal 702, while the current through current mirror 706 imposes a similar delay on positive-going input signals on input terminal 702. These delays will be substantially the same because the same current level is used to establish both delays.

The output of inverter 704 does not exhibit sharp signal transitions, but instead changes gradually due to the current-limiting effects of current source 705 and current mirror 706. Thus, the output of inverter 704 is coupled to conventional Schmitt trigger 708 to instigate sharp logic transitions on output terminal 712.

While the present invention has been described in connection with specific embodiments, variations of these embodiments will be obvious to those of ordinary skill in the art. For example, oscillator 500 of FIG. 5 might include one or more of the above-described delay circuits, or a combination of delay elements; or the foregoing delay circuits can employ additional loads, such as capacitive or resistive elements, to enhance delay. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A delay circuit for delaying a logic signal on an input terminal, the delay circuit comprising:
   a. a first inverter having a first power terminal, a second power terminal connected directly to a power-supply terminal, a control terminal connected to the input terminal to receive the logic signal, and an output terminal;
   b. a current mirror having an input terminal and an output terminal, wherein the current-mirror output terminal is connected to the first power terminal of the first inverter;
   c. a constant-current source having a reference-current terminal connected to the current-mirror input terminal;
   d. a Schmitt trigger having input and output terminals, wherein the input terminal is connected to the output terminal of the first inverter; and
   e. a second inverter having a first power terminal connected to the output terminal of the current mirror, a second power terminal connected directly to the power-supply terminal, an input terminal connected to the output terminal of the Schmitt trigger, and an output terminal.

2. The delay circuit of claim 1, wherein the constant-current source comprises a thermal-voltage-referenced current source.

3. The delay circuit of claim 1, further comprising a fourth inverter having an input terminal and an output terminal, wherein the input terminal is connected to the output terminal of the second inverter.

4. A delay circuit for delaying a logic signal on an input terminal, the delay circuit comprising:
   a. a first inverter having first and second power terminals, a control terminal connected to the input terminal to receive the logic signal, and an output terminal, wherein the second power terminal is directly connected to a power-supply terminal;
   b. a constant-current source having an input terminal and first and second output terminals, wherein the first output terminal is connected to the first power terminal of the first inverter;
   c. a first Schmitt trigger having an input terminal and an output terminal, wherein the input terminal of the first Schmitt trigger is connected to the output terminal of the first inverter;
   d. a second inverter having:
      i. an input terminal connected to the output terminal of the first Schmitt trigger; and
      ii. an output terminal;
   e. a third inverter having a first power terminal connected to the second output terminal of the constant current source, a second power terminal directly connected to the power-supply terminal, an input terminal connected to the output terminal of the second inverter, and an output terminal;
   f. a second Schmitt trigger having input and output terminals, wherein the input terminal is connected to the output terminal of the third inverter; and
   g. a fourth inverter having input and output terminals, wherein the input terminal is connected to the output terminal of the second Schmitt trigger.

5. The delay circuit of claim 4, wherein the constant-current source comprises a current mirror.

* * * * *